(12) United States Patent
Harikai et al.

(10) Patent No.: US 9,698,073 B2
(45) Date of Patent: Jul. 4, 2017

(54) METHOD OF MANUFACTURING ELEMENT CHIP AND ELEMENT CHIP

(71) Applicant: Panasonic Intellectual Property Management Co., Ltd., Osaka (JP)

(72) Inventors: Atsushi Harikai, Osaka (JP); Shogo Okita, Hyogo (JP); Noriyuki Matsubara, Osaka (JP); Mitsuru Hiroshima, Osaka (JP); Mitsuhiro Okune, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/264,921

(22) Filed: Sep. 14, 2016

(65) Prior Publication Data
US 2017/0098591 A1    Apr. 6, 2017

(30) Foreign Application Priority Data
Oct. 1, 2015   (JP) ................. 2015-195521

(51) Int. Cl.
| | |
|---|---|
| *H01L 21/318* | (2006.01) |
| *H01L 21/78* | (2006.01) |
| *H01L 21/683* | (2006.01) |
| *H01L 23/31* | (2006.01) |
| *H01L 21/02* | (2006.01) |
| *H01L 23/29* | (2006.01) |

(52) U.S. Cl.
CPC ...... *H01L 23/3185* (2013.01); *H01L 21/0212* (2013.01); *H01L 21/6835* (2013.01); *H01L 21/78* (2013.01); *H01L 23/293* (2013.01); *H01L 2221/6834* (2013.01); *H01L 2221/68327* (2013.01)

(58) Field of Classification Search
CPC .. H01L 23/3185; H01L 21/78; H01L 21/6835
See application file for complete search history.

(56) References Cited

U.S. PATENT DOCUMENTS

| | | | | |
|---|---|---|---|---|
| 2012/0012990 | A1* | 1/2012 | Pagaila | H01L 23/5389 257/659 |
| 2015/0325492 | A1* | 11/2015 | Hunziker | H01L 23/3185 257/788 |
| 2017/0069522 | A1* | 3/2017 | Hiroshima | H01L 21/6836 |

FOREIGN PATENT DOCUMENTS

JP    2002-093752    3/2002

* cited by examiner

*Primary Examiner* — Caleb Henry
*Assistant Examiner* — Mounir Amer
(74) *Attorney, Agent, or Firm* — Pearne & Gordon, LLP

(57) ABSTRACT

In a plasma processing step in a method of manufacturing an element chip in which a plurality of element chips are manufactured by dividing a substrate, which has a plurality of element regions, the substrate is divided into element chips by exposing the substrate to first plasma. In a protection film forming step of forming a protection film covering a side surface and a second surface by exposing the element chips to second plasma of which raw material gas is mixed gas of carbon fluoride and helium, protection film forming conditions are set such that a thickness of a second protection film of the second surface is greater than a thickness of a first protection film of the side surface.

3 Claims, 5 Drawing Sheets

METHOD OF MANUFACTURING ELEMENT CHIP AND ELEMENT CHIP

BACKGROUND

1. Technical Field

The present disclosure relates to a method of manufacturing an element chip in which element chips are manufactured by dividing a substrate having a plurality of element regions for each element region and an element chip.

2. Description of the Related Art

An element chip such as a semiconductor element is manufactured by dividing a wafer substrate having a plurality of element regions into individual pieces (for example, see Japanese Patent Unexamined Publication No. 2002-93752 (PTL 1)). In the related art illustrated in PTL 1, first, a back surface of a wafer is polished and the wafer is thinned by etching in a state where a front surface of the wafer is stuck to a dicing tape. Thereafter, a resist layer is formed in a portion corresponding to the element region for masking, and the wafer is subjected to plasma etching, thereby separating the wafer into individual pieces of semiconductor elements.

SUMMARY

An individual piece of the element chip that is cut out from the wafer substrate is not only used as a device after being packaged but also may be sent to an electronic component mounting step in a form of the element chip as it is as in a case of flip-chip mounting. In such a case, since the element chip is directly held by a holding tool such as a collet, the holding tool comes into direct contact with a surface of a silicon body configuring the element chip during a mounting operation. A surface of the chip may be scratched or flaws may occur in an edge portion of an outer peripheral portion of the chip during the contact. Then, such scratches and flaws cause serious damage such as damage to the chip in the subsequent step. As described above, a method of manufacturing an element chip of the related art has a problem that scratches and flaws occur on a surface of the chip thereby causing serious damage when handling the manufactured element chips.

An object of the disclosure is to provide a method of manufacturing an element chip in which it is possible to prevent occurrence of scratches and flaws on a surface of the chip, and to provide an element chip.

A method of manufacturing an element chip of the disclosure, in which a plurality of element chips are formed by dividing a substrate, which includes a first surface having a plurality of element regions defined by dividing regions and a second surface on a side opposite to the first surface, using the dividing regions as boundaries, includes the following steps. That is, the method includes a preparing step of preparing the substrate in which the first surface side of the substrate is supported on a carrier and on which an etching-resistant layer is formed so as to cover regions of the second surface opposite to the element regions and to expose regions of the second surface opposite to the dividing regions; and a plasma processing step of performing plasma processing on the substrate that is supported on the carrier, after the preparing step. The plasma processing step includes a dividing step of dividing the substrate into the element chips by etching regions of the substrate which are not covered by the etching-resistant layer in a depth direction of the substrate up to the first surface by exposing the second surface to first plasma, and causing the element chips each including the first surface, the second surface, and a side surface connecting the first surface and the second surface to be in a state of being held on the carrier with a space between each other, and a protection film forming step of forming a first protection film on the side surface of the element chip and a second protection film on the second surface by exposing the element chip to second plasma in a state where the element chip is held on the carrier with a space between each other after the dividing step. In the protection film forming step, protection film forming conditions are set such that a thickness of the second protection film is greater than a thickness of the first protection film.

An element chip of the disclosure includes a first surface having element regions, a second surface on a side opposite to the first surface, and a side surface connecting the first surface and the second surface. The side surface is coated by a first protection film, the second surface is coated by a second protection film, and a thickness of the second protection film is greater than a thickness of the first protection film According to the disclosure, it is possible to prevent occurrence of scratches and flaws a surface of a chip.

DETAILED DESCRIPTION

Next, an embodiment of the disclosure will be described with reference to the drawings. First, a method of manufacturing an element chip of the embodiment will be described with reference to FIGS. 1A to 4. The method of manufacturing the element chip illustrated in here is used for manufacturing a plurality of element chips by dividing a substrate which includes a first surface having a plurality of element regions defined by dividing regions and a second surface on a side opposite to the first surface, into the dividing regions.

Figure 1A:
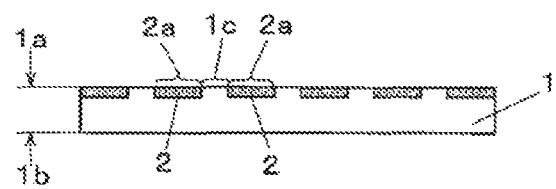
FIG. 1A is a view for explaining a step in a method of manufacturing an element chip of an embodiment of the disclosure and is a sectional view illustrating a substrate before separation.

As illustrated in FIG. 1A, substrate 1 is a wafer substrate where a plurality of element chips 10 (see FIG. 1C) having element portions 2 are formed. A plurality of element regions 2a which are defined by dividing regions 1c are set in first surface 1a that is an element surface on which element portions 2 are formed in substrate 1. Substrate 1 is sent to a preparing step for manufacturing the element chips and, as described below, support is performed by carrier 4 and mask formation is performed. As carrier 4, a member such as an adhesive sheet, which fixes substrate 1 that is thin and flexible, and is capable of handling substrate 1, is used.

Figure 1B:
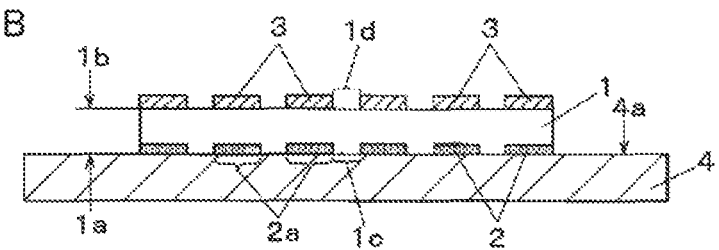
FIG. 1B is a view for explaining a step in the method of manufacturing the element chip of an embodiment of the disclosure and is a sectional view illustrating a preparing step.

In the preparing step, as illustrated in FIG. 1B, first surface 1a of substrate 1 is supported on holding surface 4a of carrier 4 and etching-resistant layers 3 is formed by a resist mask, a surface protection film, and the like functioning as a mask in plasma dicing on second surface 1b. That is, etching-resistant layers 3 are formed in second surface 1b so as to cover regions of second surface 1b facing element regions 2a and expose regions 1d of second surface 1b facing dividing regions 1c.

Figure 3:
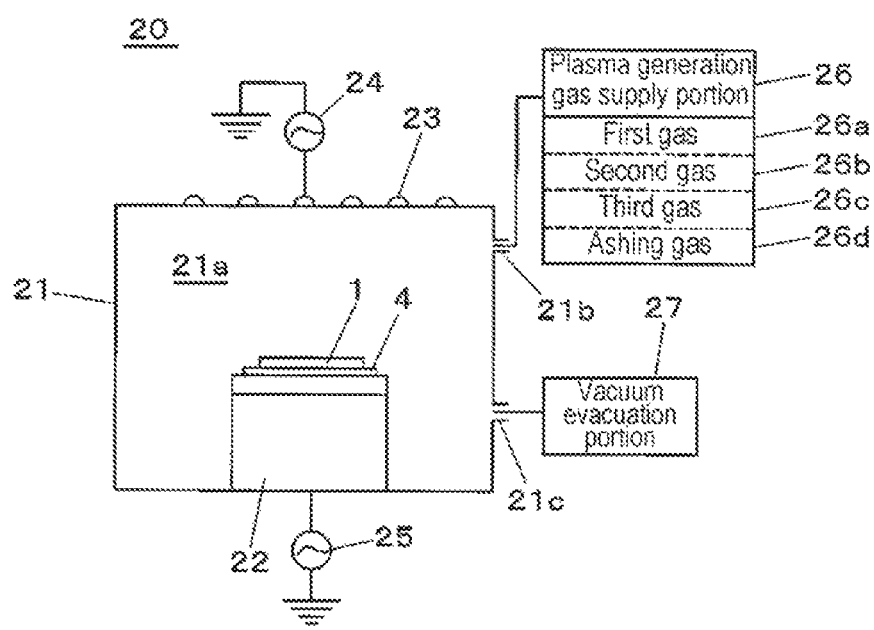
FIG. 3 is a view for explaining a configuration of a plasma etching device that is used in the method of manufacturing the element chip of an embodiment of the disclosure.

After performing the preparing step as described above, in order to perform plasma processing on substrate 1 that is supported on carrier 4, carrier 4 is sent to a plasma processing step. A configuration of plasma etching device 20 that is used in the plasma processing step will be described with reference to FIG. 3. In FIG. 3, an inside of chamber 21 that is a vacuum vessel is processing chamber 21a for performing plasma processing and stage 22, on which carrier 4 supporting substrate 1 that is to be processed is mounted, is disposed on a bottom portion of processing chamber 21a. Antennas 23 as upper electrodes are disposed on an upper surface of a top portion of chamber 21 and antenna 23 is electrically connected to first high-frequency power supply portion 24. Stage 22 within processing chamber 21a also has a function as a lower electrode for performing plasma processing and stage 22 is electrically connected to second high-frequency power supply portion 25.

Vacuum evacuation portion 27 is connected to chamber 21 via exhaust port 21c and the inside of processing chamber 21a is evacuated to vacuum by driving vacuum evacuation portion 27. Furthermore, plasma generation gas supply portion 26 is connected to processing chamber 21a via gas inlet port 21b. In plasma etching device 20 illustrated in the embodiment, it is possible to selectively supply a plurality of types of plasma generation gas depending on the purpose of plasma processing. Here, as the types of plasma generation gas, first gas 26a, second gas 26b, third gas 26c, and ashing gas 26d may be selected.

As first gas 26a, gas such as $SF_6$ or $C_4F_8$ which are excellent in etching effect for silicon is used. In the embodiment, first gas 26a is used for generating first plasma P1 to divide substrate 1 by plasma etching. As second gas 26b, mixed gas of carbon fluoride and helium such as $C_4F_8$, $C_2F_6$, $CF_4$, $C_6F_6$, $C_6F_4H_2$, $CHF_3$, and $CH_2F_2$ is used. These types of gas are used as gas for plasma CVD for forming coating by plasma processing and in the embodiment, are used for the purpose of forming a protection film on the side surface of element chip 10 obtained by dividing substrate 1. A flow ratio of helium to a total flow rate of mixed gas is appropriately set according to a combination of the types of gas. As an exemplary value, an example in which the ratio of the flow ratio of helium to the total flow rate of mixed gas is 10% to 80% can be included.

As third gas 26c, gas which is excellent in physical etching effect such as oxygen gas or argon gas is used. In the embodiment, third gas 26c is used for sputtering applications for removing an unnecessary portion of the protection film described above. Ashing gas 26d is oxygen gas and, in the embodiment, is used for the purpose of removing a resin film such as etching-resistant layer 3 after completing the mask function.

In plasma processing by plasma etching device 20, first, substrate 1 to be processed is mounted on stage 22 together with carrier 4 and the inside of processing chamber 21a is excavated to be vacuum by driving vacuum evacuation portion 27. At the same time, plasma generation gas depending on the purpose of plasma processing is supplied on the inside of processing chamber 21a by plasma generation gas supply portion 26 and the inside of processing chamber 21a is maintained at a predetermined pressure. In this state, high-frequency power is supplied on antenna 23 by first high-frequency power supply portion 24 and thereby plasma according to the type of plasma generation gas, which is supplied, is generated on the inside of processing chamber 21a. In this case, a bias voltage is applied to stage 22 as the lower electrode by second high-frequency power supply portion 25. Therefore, it is possible to exert a biasing effect for promoting entry of plasma generated on the inside of processing chamber 21a in a direction of stage 22 and to perform anisotropic etching by enhancing a plasma processing effect in a predetermined specific direction.

Figure 1C:
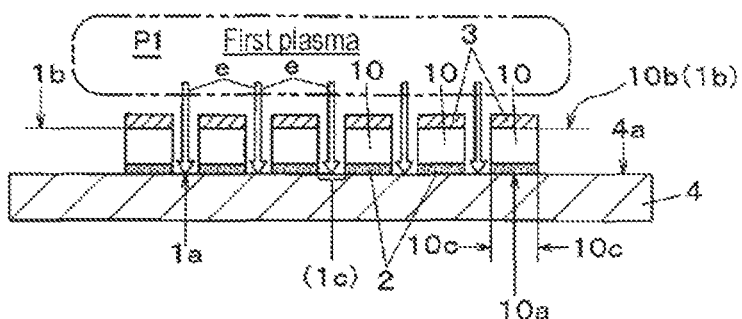
FIG. 1C is a view for explaining a step in the method of manufacturing the element chip of an embodiment of the disclosure and is a sectional view illustrating a step of dividing the substrate by performing plasma processing.

In the plasma processing step, first, processing is executed by first plasma P1 using first gas 26a described above. As illustrated in FIG. 1C, substrate 1 of region 1d (see FIG. 1B) which is not covered by etching-resistant layer 3 is etched (see arrows e) until reaching first surface 1a in the depth direction of substrate 1 by exposing second surface 1b of substrate 1 to first plasma P1 described above, etching grooves 11 (see FIG. 2A) separating each element chip 10 are formed, and substrate 1 is divided into element chips 10 of individual pieces. That is, element chips 10 including first surface 10a that is first surface 1a in the state of substrate 1, second surface 10b that is second surface 1b, and side surface 10c connecting first surface 10a and second surface 10b are in a state of being held spaced from each other on carrier 4 (dividing step).

Figure 2A:
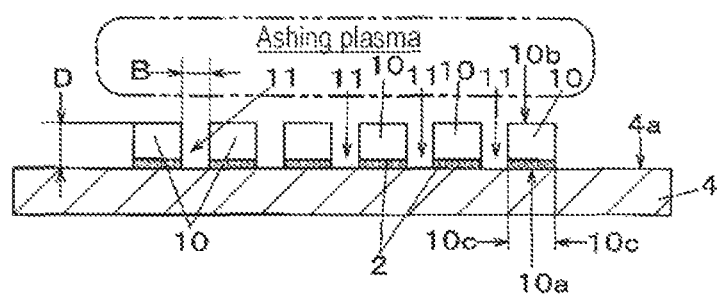
FIG. 2A is a view for explaining a step in the method of manufacturing the element chip of an embodiment of the disclosure and is a sectional view illustrating an ashing step.

In the embodiment, sizes of dividing region 1c and etching-resistant layer 3 are set such that aspect ratio (D/B) representing a ratio of width B of etching groove 11, that is, a space between adjacent element chips 10 of individual pieces on carrier 4 and depth D of etching groove 11 becomes a value within a predetermined range (for example, equal to or greater than 5 and equal to or less than 100) (see FIG. 2A). Specifically, for example, if depth D of etching groove 11 is 100 μm, width B (that is, a width of dividing region 1c) of etching groove 11 is set to equal to or greater than 1 μm and equal to or less than 20 μm. Typically, the range of depth D of etching groove 11 is equal to or greater than 20 μm and equal to or less than 800 μm, and the range of width B of etching groove 11 is equal to or greater than 4 μm and equal to or less than 100 μm.

Etching conditions in the dividing step can be appropriately selected depending on a material of substrate 1. In a case where substrate 1 is a silicon substrate, for etching in the dividing step, a so-called Bosch process can be used. In the Bosch process, it is possible to burrow region 1d that is not covered by etching-resistant layer 3 perpendicular to the depth direction of the substrate by sequentially repeating a deposition film depositing step, a deposition film etching step, and a silicon etching step.

As conditions of the deposition film depositing step, for example, a pressure on the inside of processing chamber 21a is adjusted to 15 to 25 Pa while supplying $C_4F_8$ as raw material gas at 150 to 250 sccm, input power from first high-frequency power supply portion 24 to antenna 23 is 1500 to 2500 W, input power from second high-frequency power supply portion 25 to the lower electrode is 0 W, and a processing time may be 5 to 15 seconds. As conditions of the deposition film etching step, for example, the pressure on the inside of processing chamber 21a is adjusted to 5 to 15 Pa while supplying $SF_6$ as raw material gas at 200 to 400 sccm, input power from first high-frequency power supply portion 24 to antenna 23 is 1500 to 2500 W, input power from second high-frequency power supply portion 25 to the lower electrode is 100 to 300 W, and the processing time may be 2 to 10 seconds. The sccm is a unit representing the flow rate of gas and 1 sccm represents that gas of a standard state (0° C. and 1 atm) flows by 1 cm³ in one minute.

As conditions of the silicon etching step, for example, the pressure on the inside of processing chamber 21a is adjusted to 5 to 15 Pa while supplying $SF_6$ as raw material gas at 200 to 400 sccm, input power from first high-frequency power supply portion 24 to antenna 23 is 1500 to 2500 W, input power from second high-frequency power supply portion 25 to the lower electrode is 50 to 200 W, and the processing time may be 10 to 20 seconds. In these conditions, it is possible to burrow the silicon substrate at a speed of 10 μm/min by repeating the deposition film depositing step, the deposition film etching step, and the silicon etching step.

Thereafter, ashing is performed for removing etching-resistant layer 3 in a state where second surface 10b is covered in element chip 10 of individual piece. That is, as illustrated in FIG. 2A, ashing plasma using ashing gas 26d is generated on the inside of processing chamber 21a in plasma etching device 20 and etching-resistant layer 3 containing resin as a main component is removed by ashing. Therefore, second surfaces 10b of element chips 10 divided into individual pieces are in a state of being exposed.

Conditions of ashing can be appropriately selected in accordance with a material of etching-resistant layer 3. For example, in a case where etching-resistant layer 3 is a resist film, the pressure on the inside of processing chamber 21a is adjusted to 5 to 15 Pa while supplying oxygen at 150 to 250 sccm and supplying $CF_4$ at 0 to 50 sccm as raw material gas, input power from first high-frequency power supply portion 24 to antenna 23 is 1500 to 2500 W, input power from second high-frequency power supply portion 25 to the lower electrode may be 0 to 30 W. In the conditions, it is possible to remove etching-resistant layer 3 at a speed of appropriately 1 μm/min.

Figure 2B:
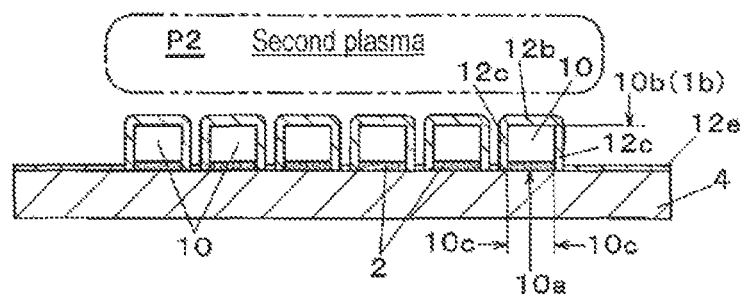
FIG. 2B is a view for explaining a step in the method of manufacturing the element chip of an embodiment of the disclosure and is a sectional view illustrating a plasma processing step.

Next, after the dividing step described above, a protection film forming step is performed. That is, in plasma etching device 20, second plasma P2 is generated by using second gas 26b that is mixed gas of carbon fluoride and helium within processing chamber 21a and, as illustrated in FIG. 2B, element chips 10 are exposed to second plasma P2 in a state of being held with spaced from each other on carrier 4. Therefore, first protection film 12c is formed on side surface 10c of element chip 10 and second protection film 12b is formed on second surface 10b.

These protection films are formed for the purpose of suppressing the creep-up of the conductive material in the mounting process for directly bonding element chip 10 to a package substrate and the like and preventing damage such as scratches and flaws on the surface of the element when handling element chip 10 for mounting. Therefore, it is preferable that the protection films have less hygroscopicity and dense composition. In the embodiment, as raw material gas of second plasma P2 used for forming the protection films, since mixed gas of carbon fluoride and helium is used, fluorocarbon film containing fluorine and carbon is formed as the protection film and it is possible to form the protection films which has less hygroscopicity and dense composition, and excellent in adhesion. In the protection film forming step, high-frequency bias is applied to stage 22 (see FIG. 3) on which carrier 4 is mounted. Therefore, incidence of ions into element chip 10 is promoted and it is possible to form the protection film having more dense composition and high adhesion.

Furthermore, in the embodiment, when handling element chip 10 for mounting, for example, in order to prevent damage in the surface of the element when holding element chip 10 by an adsorption and holding tool such as collet, protection film forming conditions are set such that a thickness of second protection film 12b formed on second surface 10b that is a holding surface in element chip 10 is greater than a thickness of first protection film 12c formed in side surface 10c.

As the protection film forming conditions to cause the thickness of second protection film 12b to be greater than the thickness of first protection film 12c, in the embodiment, the pressure on the inside of processing chamber 21a in the protection film forming step and the aspect ratio that is defined by ratio (D/B) of width B and depth D of etching groove 11 illustrated in FIG. 2A are set to values of predetermined ranges.

As pressure conditions of the inside of processing chamber 21a, for example, the pressure on the inside of processing chamber 21a is adjusted to 5 to 25 Pa while supplying $C_4F_8$ at 150 sccm and He at 50 sccm as raw material gas. Then, in the conditions, input power from first high-frequency power supply portion 24 to antenna 23 is 1500 to 2500 W, input power from second high-frequency power supply portion 25 to the lower electrode is 50 to 150 W. Reaction products by plasma are unlikely to enter into the space between adjacent element chips 10 and it is possible to obtain an effect that the thickness of second protection film 12b formed on second surface 10b is increased with respect to first protection film 12c deposited on side surface 10c by setting such a processing pressure in high-pressure conditions. In this case, it is possible to further increase the effect by setting the aspect ratio that is defined by the ratio (D/B) of width B and depth D of etching groove 11 to a predetermined range (for example, 5 to 100).

Figure 4:
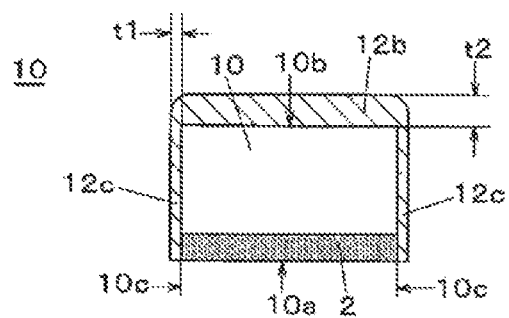
FIG. 4 is a view for explaining a configuration of the element chip manufactured by the method of manufacturing the element chip of an embodiment of the disclosure.

FIG. 4 illustrates element chip 10 manufactured by such a method of manufacturing. Element chip 10 is configured to include first surface 10a having element regions 2a (see FIG. 1A) corresponding to element portion 2, second surface 10b on a side opposite to first surface 10a, and side surface 10c connecting first surface 10a and second surface 10b. Then, side surface 10c is coated by first protection film 12c and second surface 10b is coated by second protection film 12b. Here, thickness t2 of second protection film 12b is greater than thickness t1 of first protection film 12c (for example, thickness t2 is equal to or greater than three times thickness t1).

Figure 5:
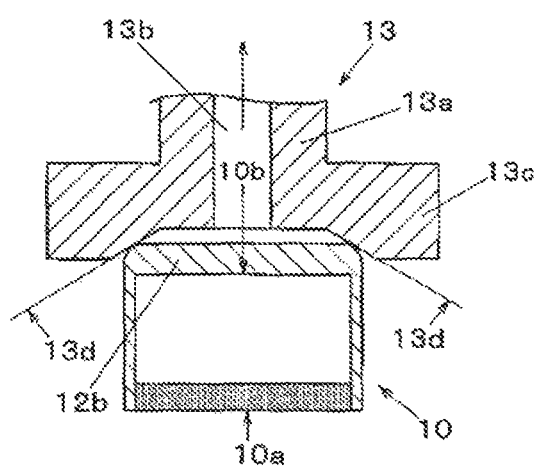
FIG. 5 is an explanatory view of a holding state of the element chip manufactured by the method of manufacturing the element chip of an embodiment of the disclosure.

FIG. 5 illustrates a state where element chip 10 having such a configuration is adsorbed and held by collet 13. Collet 13 is has a configuration in which flange-shaped holding portion 13c is provided in a lower end portion of shaft portion 13a having suction hole 13b. Tapered holding surface 13d is formed on a lower surface of holding portion 13c and second surface 10b abuts against holding surface 13d and is vacuum-sucked from suction hole 13b when holding element chip 10 by collet 13. Element chip 10 is held in collet 13 by a vacuum-suction force.

In the holding state of element chip 10, second protection film 12b having thickness t2 that is sufficiently greater than thickness t1 of first protection film 12c of side surface 10c is formed in second surface 10b. Therefore, edges on second surface 10b side are protected by second protection film 12b against an external force caused by pressing of element chip 10 against holding surface 13d. Therefore, it is possible to effectively prevent occurrence of damage such as scratches and flaws on the chip surface of element chip 10 during handing element chip 10 in the mounting process and the like.

As described above, in the method of manufacturing the element chip illustrated in the embodiment, in the plasma processing step, after substrate 1 is divided into element chips 10 by exposing substrate 1 to first plasma P1, element chip 10 is exposed to the second plasma of which raw material gas is mixed gas of carbon fluoride and helium. Then, in the protection film forming step in which the protection film covering side surface 10c and second surface 10b is formed, the protection film forming conditions are set such that thickness t2 of second protection film 12b of second surface 10b is greater than thickness t1 of first protection film 12c of side surface 10c. Therefore, the chip surface is protected against the external force acting on second surface 10b of element chip 10 in the mounting process and the like, and it is possible to prevent occurrence of scratches and flaws on the chip surface.

The method of manufacturing the element chip and the element chip of the disclosure have the effect that occurrence of scratches and flaws on the chip surface is prevented and are useful in a field of manufacturing the element chips by dividing the substrate having the plurality of element regions for each of the element regions.

What is claimed is:

1. A method of manufacturing an element chip, in which a plurality of element chips are formed by dividing a substrate, which includes a first surface having a plurality of element regions defined by dividing regions and a second surface on a side opposite to the first surface, using the dividing regions as boundaries, the method comprising:

a preparing step of preparing the substrate in which the first surface side of the substrate is supported on a carrier and on which an etching-resistant layer is formed on the second surface so as to cover regions of the second surface opposite to the element regions and to expose regions of the second surface opposite to the dividing regions; and a plasma processing step of performing plasma processing on the substrate that is supported on the carrier, after the preparing step, wherein the plasma processing step includes a dividing step of dividing the substrate into the element chips by etching regions of the substrate which are not covered by the etching-resistant layer in a depth direction of the substrate up to the first surface by exposing the second surface to first plasma, and causing the element chips each including the first surface, the second surface, and a side surface connecting the first surface and the second surface to be in a state of being held on the carrier with a space between each other, and a protection film forming step of forming a first protection film on the side surface of the element chip and a second protection film on the second surface by exposing the element chips to second plasma in a state where the element chip is held on the carrier with the space between each other after the dividing step, and wherein in the protection film forming step, protection film forming conditions are set such that a thickness of the second protection film is greater than a thickness of the first protection film.

2. The method of manufacturing an element chip of claim 1, wherein the first protection film and the second protection film are fluorocarbon films.

3. The method of manufacturing an element chip of claim 2, wherein protection film forming gas for generating the second plasma contains carbon fluoride.

* * * * *